(12) United States Patent
Ishimaru et al.

(10) Patent No.: US 7,551,452 B2
(45) Date of Patent: Jun. 23, 2009

(54) PRINTED CIRCUIT BOARD

(75) Inventors: Yasuto Ishimaru, Ibaraki (JP); Kei Nakamura, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 29 days.

(21) Appl. No.: 11/427,448

(22) Filed: Jun. 29, 2006

(65) Prior Publication Data

US 2007/0000689 A1 Jan. 4, 2007

(30) Foreign Application Priority Data

Jul. 4, 2005 (JP) ............................. 2005-194567

(51) Int. Cl.
*H05K 7/00* (2006.01)

(52) U.S. Cl. ...................... 361/760; 174/255

(58) Field of Classification Search ................ 174/255, 174/257, 258; 361/748, 752, 760; 439/59, 439/67, 68
See application file for complete search history.

(56) References Cited

U.S. PATENT DOCUMENTS

| 3,657,807 | A | * | 4/1972 | Shaheen et al. ............... 29/604 |
| 4,814,855 | A | * | 3/1989 | Hodgson et al. ............. 174/558 |
| 5,262,722 | A | * | 11/1993 | Hedengren et al. .......... 324/242 |
| 5,664,325 | A | * | 9/1997 | Fukutomi et al. ............. 29/848 |
| 6,015,607 | A | * | 1/2000 | Fraivillig .................... 428/214 |
| 6,055,722 | A | * | 5/2000 | Tighe et al. .................... 29/843 |
| 6,504,096 | B2 | * | 1/2003 | Okubora ...................... 174/521 |
| 2002/0044331 | A1 | * | 4/2002 | Agrawal et al. ............. 359/265 |
| 2003/0006509 | A1 | | 1/2003 | Suzuki et al. |
| 2003/0053258 | A1 | * | 3/2003 | Dunn et al. ............... 360/245.9 |
| 2004/0177982 | A1 | * | 9/2004 | Shibata .................. 174/35 MS |
| 2004/0247921 | A1 | * | 12/2004 | Dodsworth et al. ......... 428/544 |
| 2005/0056915 | A1 | | 3/2005 | Sumi |
| 2005/0186702 | A1 | | 8/2005 | Saimen |
| 2005/0230790 | A1 | | 10/2005 | Naito |

FOREIGN PATENT DOCUMENTS

| JP | 2003-068804 A | | 3/2003 |
| JP | 2003068804 | * | 3/2003 |
| JP | 2004-134442 A | | 4/2004 |
| JP | 2005-150373 A | | 6/2005 |

* cited by examiner

*Primary Examiner*—Dean A. Reichard
*Assistant Examiner*—Yuriy Semenenko
(74) *Attorney, Agent, or Firm*—Panitch Schwarze Belisario & Nadel LLP (57) ABSTRACT

In an outer lead portion, outer lead wirings are provided on one surface of a base insulating layer and a plurality of metal substrates are provided on the opposite surface thereof. The plurality of metal substrates are provided with predetermined spacings therebetween. The outer lead wirings are not provided on the areas on the surface opposite to the areas on the other surface of the base insulating layer on which the slits are provided between the metal substrates. Metals such as stainless steel, copper or copper alloy can be used for the metal substrates. Coefficient of linear expansion of each metal substrate is preferably equal to that of the base insulating layer.

14 Claims, 6 Drawing Sheets

PRINTED CIRCUIT BOARD

BACKGROUND OF THE INVENTION

1. Field of the Invention

The present invention relates to a printed circuit board used for various electronic devices.

2. Description of the Background Art

In a printed circuit board, conductive patterns are on one surface of a base insulating layer and a reinforcement layer is formed on the opposite surface of the base insulating layer in some cases (see JP 2004-134442 A, for example). This reinforces the printed circuit board.

Hereinafter, the printed circuit board on which a semiconductor device is to be mounted will be described briefly.

Figure 4:
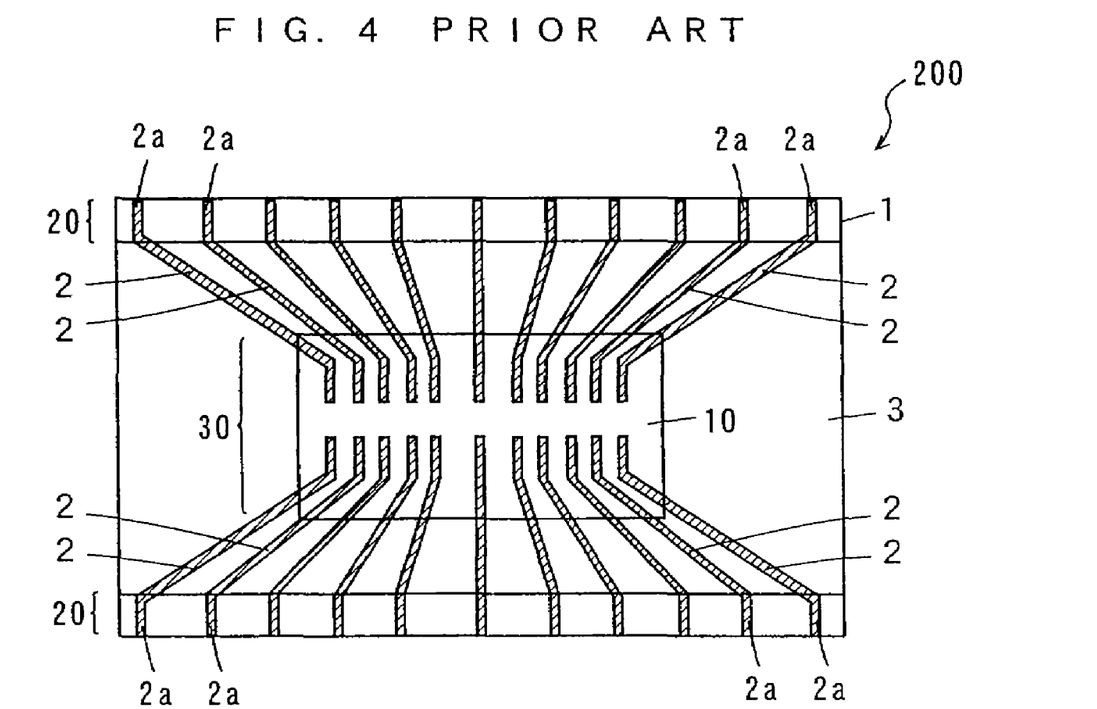
FIG. 4 is a plan view of a conventional printed circuit board.

FIG. 4 is a plan view of a conventional printed circuit board 200. As shown in FIG. 4, a plurality of conductive patterns 2 are formed on a base insulator layer 1 composed of, for example, polyimide. The conductive patterns 2 have those formed to extend from the center of the base insulating layer 1 toward one side of the base insulating layer 1 and the others formed to extend from the center toward the other side of the base insulating layer 1.

A cover insulating layer 3 is provided to cover an area excluding the area of one side and the area of other side of the base insulating layer 1. The area in which the end of each conductive pattern 2 is not covered by this cover insulating layer 3 is referred to as an outer lead portion 20.

In addition, the end of each conductive pattern 2 in the central part of the base insulating layer 1 is mounted with a semiconductor device that is not illustrated. The mounting area of this semiconductor device is shown as a semiconductor device mounting part 10 in FIG. 4. The area where each conductive pattern 2 is positioned within this semiconductor device mounting part 10 is referred to as an inner lead portion 30.

Hereinafter, the part of each conductive pattern 2 on the outer lead portion 20 in the printed circuit board 200 will be referred to as an outer lead wiring 2a.

Next, how the outer lead wiring 2a is connected to a terminal part of a glass substrate of a liquid crystal display or the like will be described.

Figure 5:
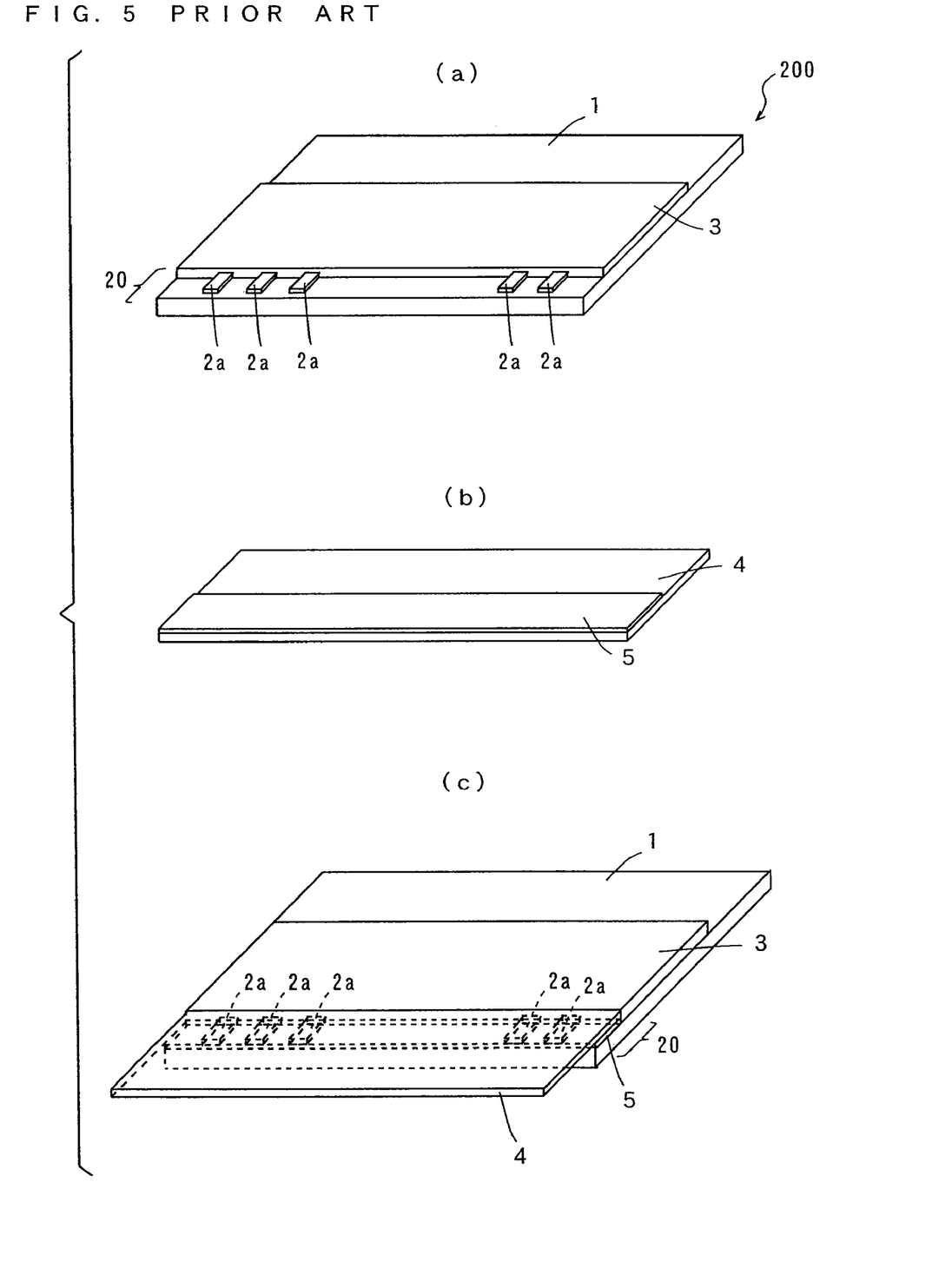
FIG. 5 is a perspective view illustrating how the printed circuit board and the glass substrate of a liquid crystal display are connected.

FIG. 5 is a perspective view showing how the printed circuit board 200 is connected to the glass substrate of the liquid crystal display.

As shown in FIG. 5(a), a plurality of conductive patterns 2 are provided on the base insulating layer 1. Since a part of the above-mentioned printed circuit board 200 of FIG. 4 is illustrated simplistically in FIG. 5(a), and its configuration is the same as that of the printed circuit board 200 in FIG. 4, the description will not be given.

As illustrated in FIG. 5(b), a plurality of terminal parts (drawn in FIG. 6 which will be described below) are provided on one surface of a glass substrate 4, and an integrated anisotropic conductive film (ACF) 5 is provided on these terminal parts.

As shown in FIG. 5(c), the outer lead wirings 2a of the printed circuit board 200 are connected with the terminal parts on the glass substrate 4 such that the anisotropic conductive film 5 of this glass substrate 4 is jointed onto the outer lead wirings 2a of the printed circuit board 200.

In this case, after the terminal parts on the glass substrate 4 are overlaid on the outer lead wirings 2a such that these terminal parts are attached onto the outer lead wirings 2a by the anisotropic conductive film 5, heat treatment (heat press) is carried out in the temperature environment of about 180° C., for several to several tens of seconds. This allows the terminal parts on the glass substrate 4 to be connected with the outer lead wirings 2a of the printed circuit board 200.

However, the following problems will arise. That is to say, the above-mentioned heat treatment causes expansion of the base insulating layer 1 of the printed circuit board 200 and the glass substrate 4. In this case, the heat treatment for several to several tens of seconds could not necessarily stabilize the coefficient of expansion of the base insulating layer 1 and glass substrate 4.

In addition, the base insulating layer 1 composed of polyimide absorbs moisture at room temperature. The base insulating layer 1 releases the moisture and contracts when the above-mentioned heat treatment is carried out. In this case, even the contraction of the base insulating layer 1 could not be necessarily stabilized due to environmental changes. This causes, as illustrated in FIG. 6(a), misalignment of connection between the respective outer lead wirings 2a of the printed circuit board 200 and each terminal part 6 of the glass substrate 4.

Figure 6:
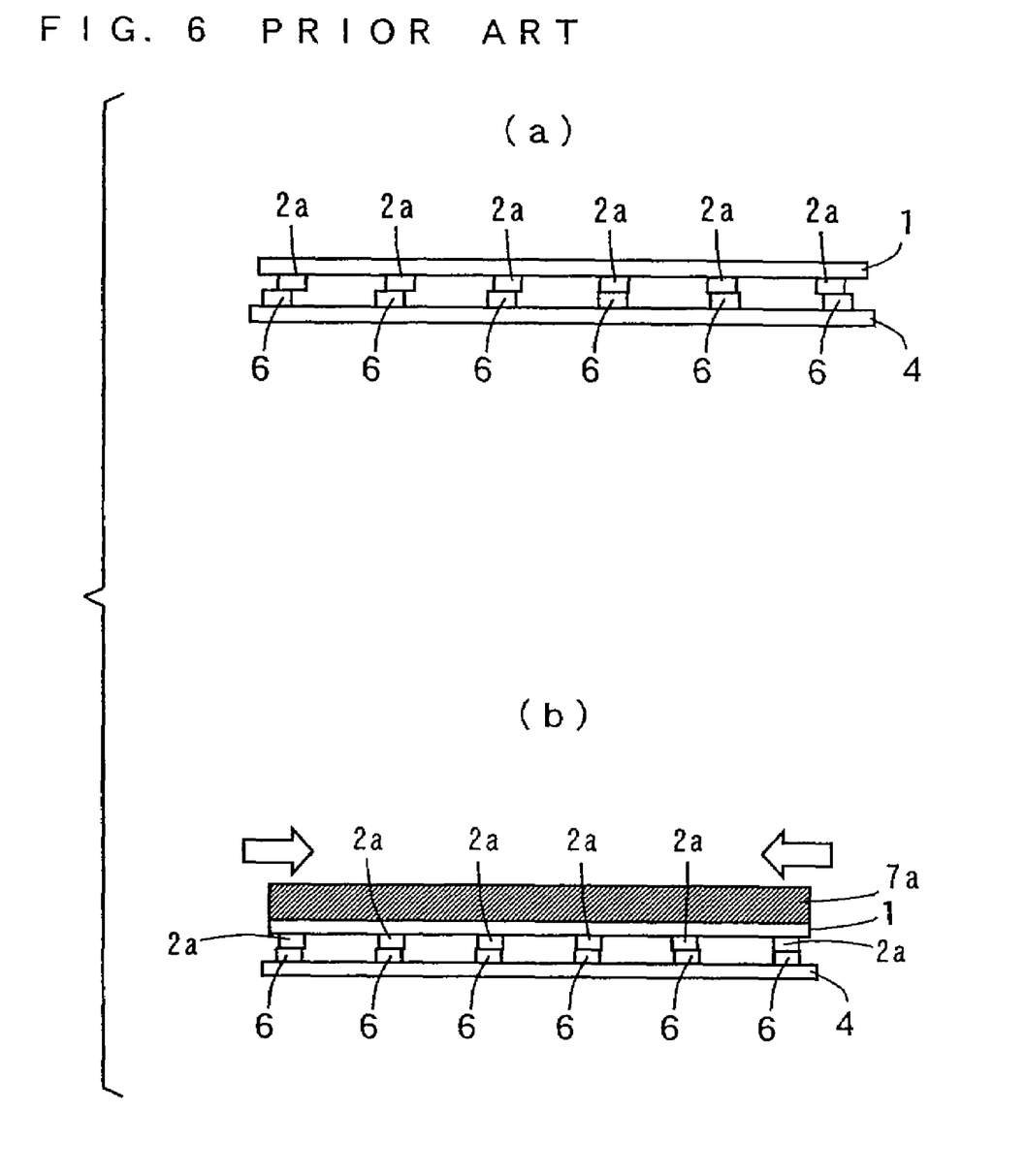
FIG. 6 is a schematic diagram for use in illustrating how each outer lead wiring of the printed circuit board and each terminal part of the glass substrate are connected.

Therefore, in order to reduce the above-mentioned expansion and contraction of the base insulating layer 1, as shown in FIG. 6(b), a back surface pattern (reinforcement pattern) 7a made of metal is attached onto the opposite surface of the base insulating layer 1 to the surface on which the outer lead wirings 2a are placed (see JP 2003-68804 A, for example).

However, when the environmental temperature becomes room temperature after the above-mentioned heat treatment, contraction stress remains in the above-mentioned back surface pattern 7a. In particular, the remaining contraction stress in the area of the outer lead wirings 2a on both ends of the base insulating layer 1 is remarkably large. As a result, the respective connected outer lead wirings 2a and terminal parts 6 might be stripped in some cases.

SUMMARY OF THE INVENTION

It is an object of the invention to provide a printed circuit board capable of improving reliability of connection between a conductive pattern of a printed circuit board and a terminal part on a glass substrate.

A printed circuit board on which a semiconductor is to be mounted according to one aspect of the present invention includes an insulating layer having a first surface and a second surface, a conductive pattern provided on the first surface of the insulating layer, a cover layer provided on the first surface to cover the conductive pattern excluding at least one side area, and a reinforcement layer provided on an area on the second surface opposite to the one side area, wherein the reinforcement layer has one or a plurality of slits formed such that part of the second surface of the insulating layer is exposed.

In the printed circuit board, the conductive pattern is provided on the first surface of the insulator layer. The conductive pattern excluding at least one side area is covered by the cover layer. In addition, the reinforcement layer is provided on the area on the second surface opposite to the one side area. This reinforcement layer is formed such that part of the second surface of the insulating layer is exposed.

Generally, after the terminal part on the glass substrate is lapped on the conductive pattern on the above-mentioned one side area by an anisotropic conductive adhesive or the like, heat treatment (heat press) is carried out.

In the printed circuit board according to the present invention, provision of the one or a plurality of slits prevents contraction stress from remaining in the reinforcement layer when the environmental temperature reaches the room temperature after the above-mentioned heat treatment. In particular, such provision of slits prevents the contraction stress from remaining on the conductive pattern on the above-mentioned one side area of the base insulating layer. This prevents stripping between the conductive pattern on the one side area and the terminal part on the glass substrate which are connected with each other, resulting in an improvement of the reliability of connection.

The one or the plurality of slits may be formed to extend in a longitudinal direction of the conductive pattern. This sufficiently prevents the contraction stress from remaining in the above-mentioned reinforcement layer. As a result, the reliability of connection can be improved.

The conductive pattern may be provided on an area excluding an area on the first surface corresponding to the one or a plurality of slits. This sufficiently prevents the conductive pattern from being influenced by the contraction of the reinforcement layer. As a result, the reliability of connection can be further improved.

The reinforcement layer may include metal. This sufficiently restrains thermal expansion of the insulating layer and the contraction thereof caused by dehydration.

The metal may include stainless steel. Thus, corrosive resistance is improved.

The insulating layer may include a polyimide film, a polyethylene terephthalate film, a polyethernitrile film or a polyethersulfone film. In this case, good insulation can be assured.

The conductive pattern may include copper, copper alloy, gold or aluminum. In this case, good electrical connection can be obtained.

Other features, elements, characteristics, and advantages of the present invention will become more apparent from the following description of preferred embodiments of the present invention with reference to the attached drawings.

DESCRIPTION OF THE PREFERRED EMBODIMENTS

A printed circuit board according to the invention will be described below with reference to the drawings. As a manufacturing method of the printed circuit board according to the embodiment of the invention, the known subtractive method, additive method or semi-additive method, for example, is employed.

First of all, the manufacturing method of the printed circuit board will be described. In the embodiment of the invention, the manufacturing method of the printed circuit board by the semi-additive method will be described as one typical example.

Figure 1:
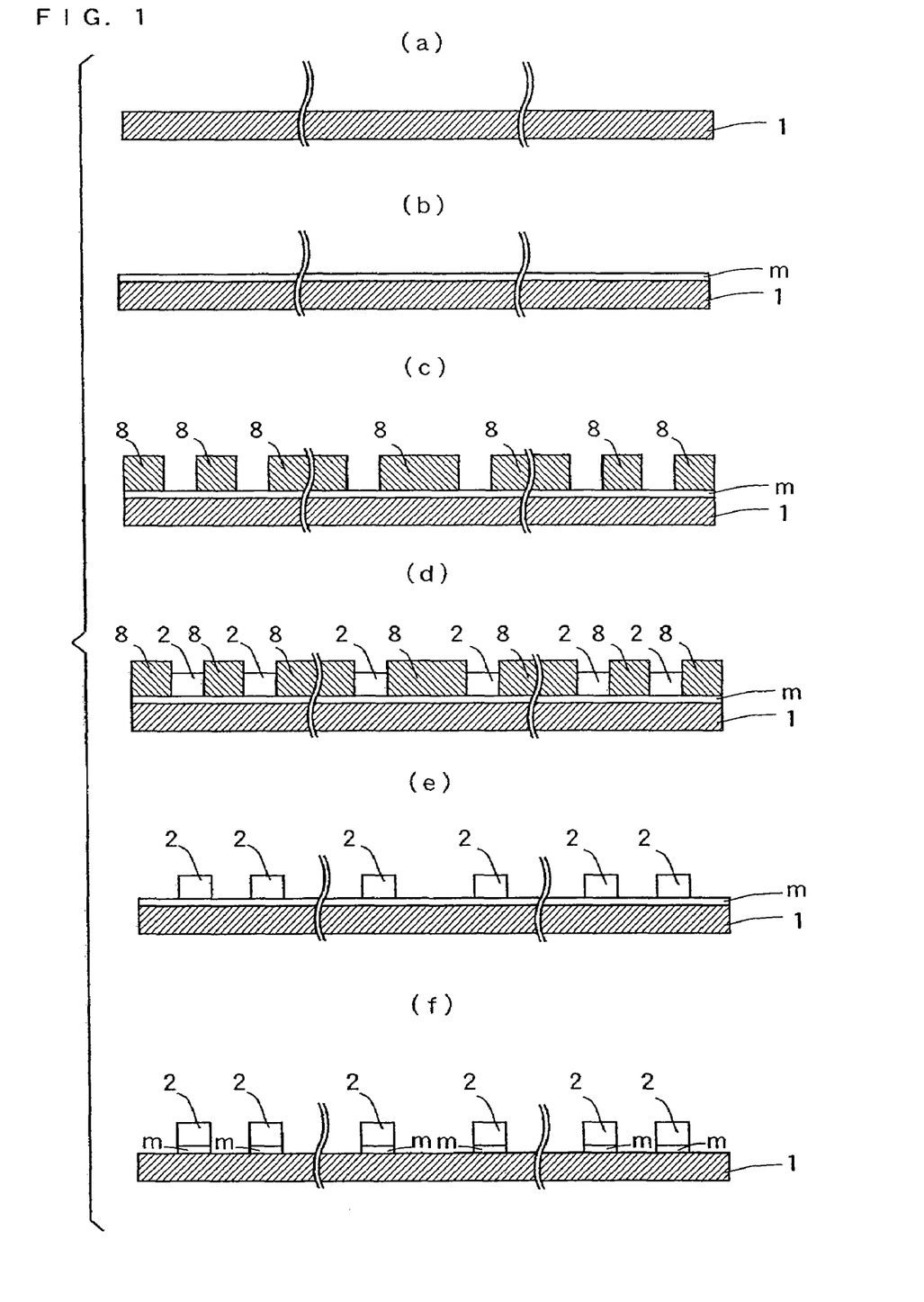
FIG. 1 is a schematic cross-sectional view of processes showing an example of a manufacturing method of a printed circuit board by semi-additive method.

FIG. 1 is a schematic cross-sectional view of process showing one example of the manufacturing method of the printed circuit board by the semi-additive method.

As illustrated in FIG. 1(a), a base insulating layer 1 made of a polyimide film is prepared first. The thickness of this base insulating layer 1 is preferably 5 to 70 μm and more preferably 25 to 40 μm.

Next, as shown in FIG. 1(b), a metal thin film m is formed on the base insulating layer 1 by sputtering or electroless plating. Note that this metal thin film m is comprised of a stacked film including, for example, a 30-nm-thick layer of chromium (Cr) and a 150-nm-thick layer of copper (Cu).

As shown in FIG. 1(c), by using dry film resist, etc. on the metal thin film m, plating resists 8 are formed whose patterns are opposite to conductive patterns formed in the post-process.

After that, as shown in FIG. 1(d), on the surface of metal thin film m where the plating resists 8 are not formed, conductive patterns 2 are formed by electrolytic copper plating. Thickness of the conductive patterns 2 is preferably 5 to 40 μm and more preferably 8 to 15 μm.

Following the above, as illustrated in FIG. 1(e), the plating resists 8 are removed by way of stripping or the like.

Then, as shown in FIG. 1(f), the copper layer of the metal thin film m except the area under conductive patterns 2 is removed by chemical etching. A liquid mixture of hydrogen peroxide and sulfuric acid is used as an etchant.

Then, the nickel-chromium layer of the metal thin film m except the area under the conductive patterns 2 is removed by chemical etching. A liquid mixture of hydrochloric acid and sulfuric acid is used as an etchant.

Following these processes, a plurality of given conductive patterns 2 are formed on the base insulating layer 1.

Next, a more detailed description will be made with reference to an overall view of the printed circuit board formed as the above.

Figure 2:
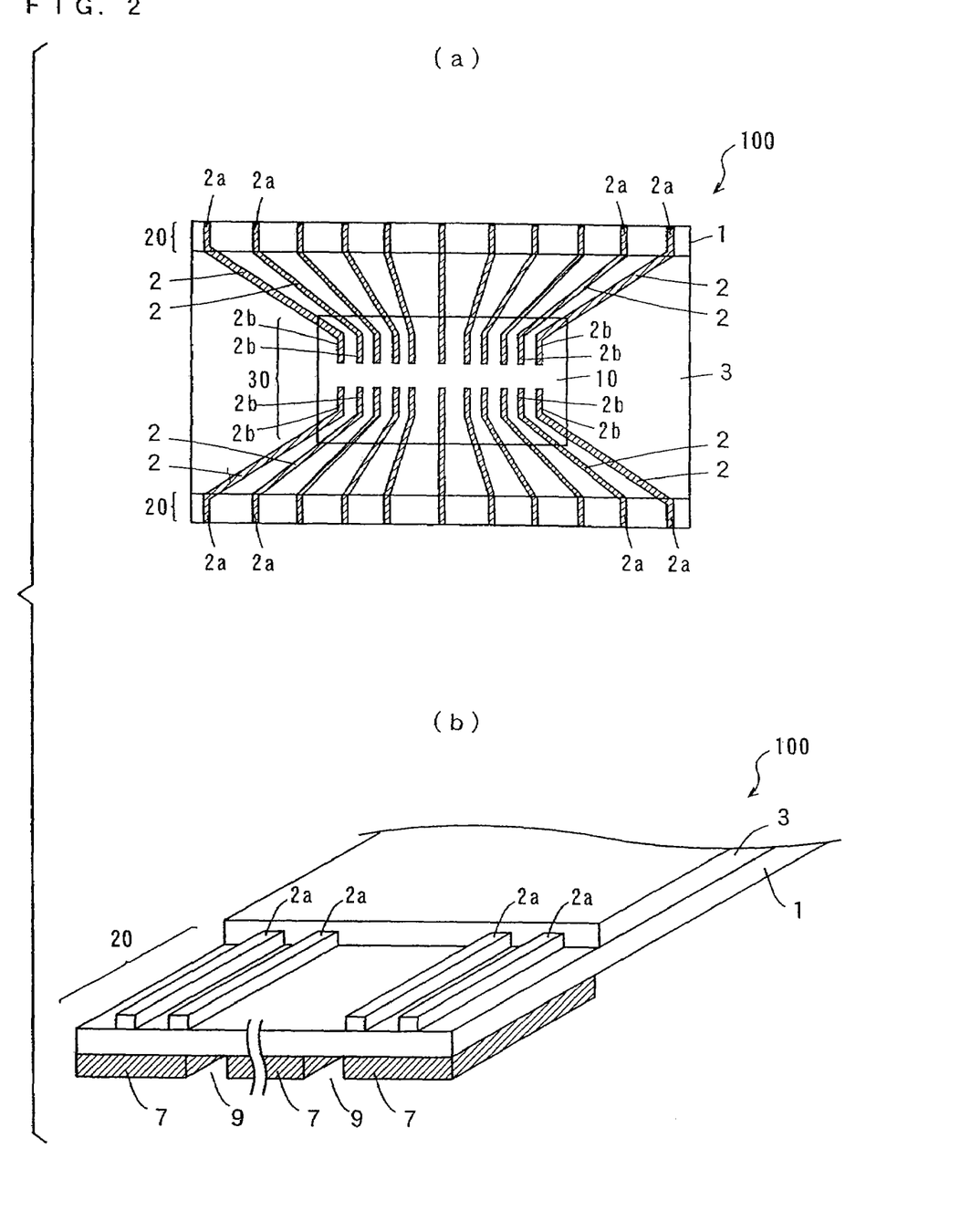
FIG. 2 is a plan view and a perspective view illustrating a printed circuit board according to the embodiment.

FIG. 2 is a plan view and a perspective view showing a printed circuit board according to the embodiment of the invention.

As shown in FIG. 2(a), the plurality of conductive patterns 2 are formed on the base insulating layer 1. The plurality of conductive patterns 2 include those formed toward one side along from the central part of the base insulating layer 1 and the others formed toward the other side from the central part thereof.

A cover insulating layer 3 is provided to cover the area except one side area and the other side area of the base insulating layer 1. The area in which this cover insulating layer 3 does not cover the respective ends of the conductive patterns 2 is referred to as an outer lead portion 20.

Additionally, a semiconductor device which is not illustrated is mounted on the ends of the conductive patterns 2 on the center part of the base insulating layer 1. The mounted area of this semiconductor device is illustrated as a semiconductor device mounting part 10 in FIG. 2(a). The area where the conductive patterns 2 are positioned within this semiconductor device mounting part 10 is referred to as an inner lead portion 30. The inner lead portion 30 is not covered with the cover insulating layer 3.

Hereinafter, the portion of each conductive pattern 2 on the inner lead portion 30 connected to a terminal of the semiconductor device is referred to as an inner lead wiring 2b. The portion of each conductive pattern 2 on the outer lead portion 20 of the printed circuit board 200 is referred to as an outer lead wiring 2a.

The width of the outer lead wiring 2a is preferably 5 to 200 μm and more preferably 10 to 150 μm. The space between adjacent outer lead wirings 2a is preferably 5 to 200 μm and more preferably 10 to 150 μm.

The width of the inner lead wiring 2b is preferably 5 to 150 μm and more preferably 8 to 50 μm. The space between adjacent inner lead wirings 2b is preferably 5 to 150 μm and more preferably 8 to 50 μm.

As shown in FIG. 2(b), according to the embodiment of the invention, a plurality of reinforcement layers 7 are provided on a surface opposite to the surface of the base insulating layer 1 on which the outer lead wirings 2a are provided. These reinforcement layers 7 are made of metal substrates.

The plurality of reinforcement layers 7 are arranged with predetermined spaces therebetween. The parts in which the reinforcement layers 7 are not provided are shown as slits 9 in FIG. 2(b). In this case, the slits 9 are formed by forming an integrated reinforcement layer 7 on the base insulating layer 1 and etching this reinforcement layer 7 with chemicals. The surfaces of the base insulating layer 1 in the slits 9 are exposed respectively.

According to the embodiment of the invention, the outer lead wirings 2a are not provided on the surface opposite to the surface of the base insulating layer 1 on which the above-described slits 9 are provided.

Metals such as stainless steel, copper, copper alloy and the like can be used as the reinforcement layers 7. The coefficient of linear expansion of the reinforcement layers 7 is preferably equal to that of the base insulating layer 1.

In particular, from the viewpoint of the corrosiveness, it is preferable to use stainless steel as the reinforcement layers 7. The thickness of each reinforcement layer 7 is preferably 5 to 60 μm and more preferably 15 to 30 μm.

The width of each slit 9 is preferably 5 to 200 μm and more preferably 10 to 150 μm. The spacing between the adjacent slits 9 is preferably 10 to 24000 μm and more preferably 12000 to 24000 μm.

According to the embodiment of the invention, the reinforcement layers 7 may be joined onto the base insulating layer 1 with an adhesive, alternatively, the base insulating layer 1 may be formed on the reinforcement layers 7 and then the conductive patterns 2 and the cover insulating layer 3 may be provided in the order.

As the material of the base insulating layer 1, not only a polyimide film but also other insulation materials such as a polyethylene terephthalate film, a polyethernitrile film or a polyethersulfone film may be used.

As the material of the conductive patterns 2, not only copper but also other metals such as copper alloy, gold or aluminum may be used.

(Effects in the Embodiment of the Invention)

Generally, after the outer lead wirings 2a of the printed circuit board 100 are overlaid and joined on the terminal parts on the glass substrate used for the liquid crystal display with anisotropic conductive film (ACF) interposed therebetween, heat treatment (heat press) is carried out for several seconds to several tens of seconds in temperature environment of about 180° C.

According to the embodiment of the invention, the plurality of reinforcement layers 7 are provided with the slits 9 therebetween on the surface of the base insulating layer 1 opposite to its surface on which the outer lead wirings 2a are provided.

In this way, forming the slits 9 between the above-mentioned reinforcement layers 7 prevents contraction stress from remaining in the reinforcement layers 7 when the environmental temperature reaches room temperature after the above-described heat treatment. Forming the slits 9 prevents, especially, the contraction stress from remaining in the area of the outer lead wirings 2a at both ends of the base insulating layer 1. This prevents stripping between each outer lead wiring 2a and each terminal part on the glass substrate which are connected with each other, which results in the improved reliability of connection.

In addition, it is preferable not to provide the outer lead wirings 2a on the area of the surface of the base insulating layer 1 opposite to its surface on which the above-mentioned slits 9 are provided. This further improves the reliability of connection.

Moreover, as mentioned above, the thickness of the base insulating layer 1 is preferably 5 to 70 μm and more preferably 25 to 40 μm. This causes the contraction stress of the reinforcement layers 7 to be relieved.

(Correspondence Between Each Constituent Element of the Claims and Each Element of the Embodiment)

According to the embodiment of the invention, the base insulating layer 1 corresponds to an insulating layer, the cover insulating layer 3 corresponds to a cover layer, and the slits 9 corresponds to a slit.

EXAMPLES

A printed circuit board of this inventive example will be described below with reference to the drawings.

Inventive Example 1

Figure 3:
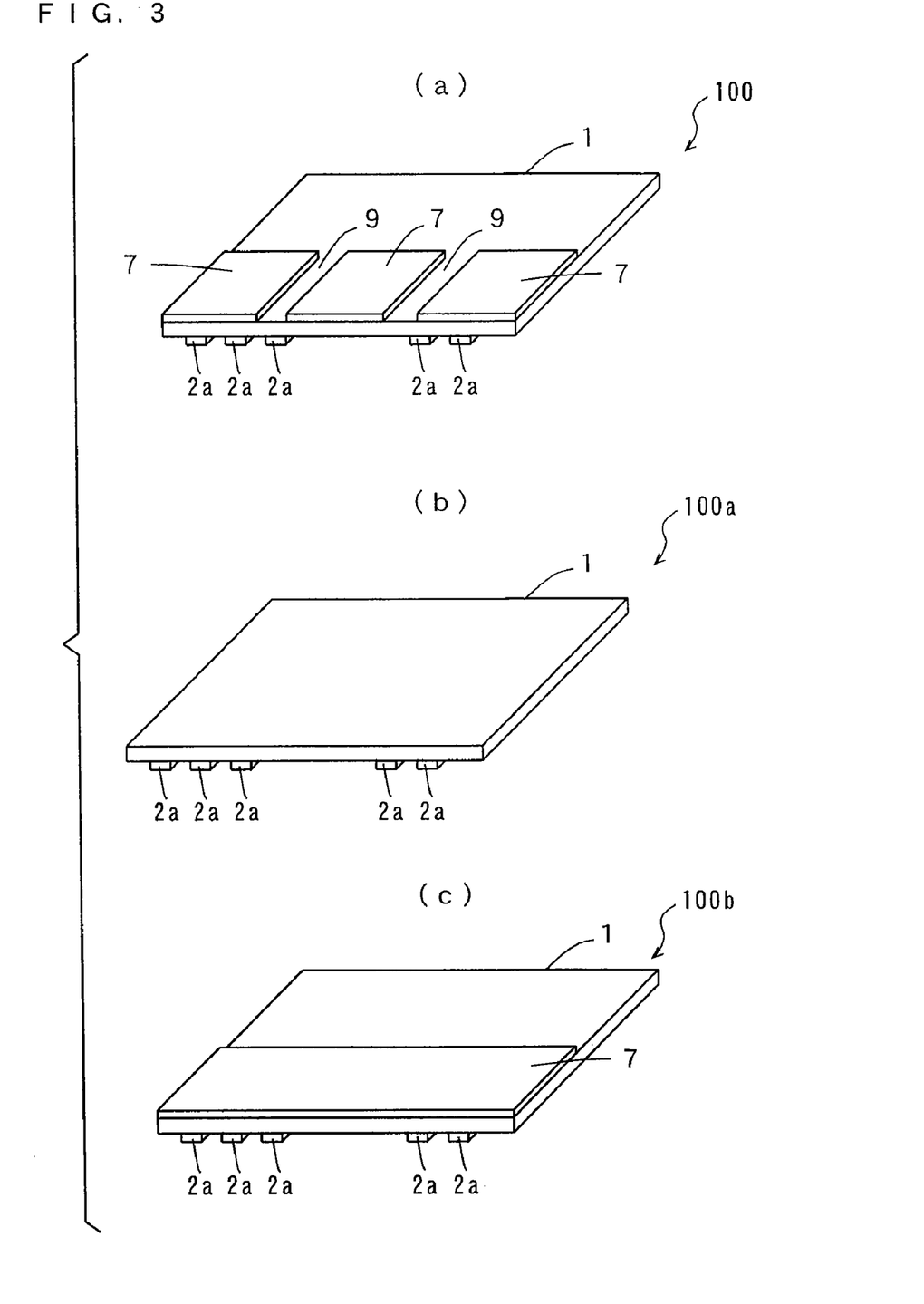
FIG. 3 is a perspective view illustrating printed circuit boards of inventive example 1, comparative examples 1 and 2.

In the inventive example 1, based on the above embodiment of the invention, a printed circuit board 100 in FIG. 3(a) was manufactured. A detailed description will be given below.

As shown in FIG. 1, a base insulating layer 1 including a 25-μm-thick polyimide layer was formed by applying a polyimide precursor solution on a reinforcement layer 7 made of 20-μm-thick stainless steel and then drying and hardening the same.

Next, a metal thin film m including a stacked film of a thin film containing 30-nm-thick chromium (Cr) and a thin film containing 150 nm thick copper was formed by sputtering on the base insulating layer 1.

A 20-μm-thick plating resist 8 was stacked on the formed metal thin film m, and then predetermined plating resists 8 were formed by an ultraviolet exposure process and a developing process. Next, conductive patterns 2 having the thickness of 8 μm were formed with electrolyte copper plating on the exposed metal thin film m where the plating resists 8 were not formed, and then the plating resist 8 was removed. Then, the exposed metal thin film m was removed with chemicals.

Consecutively, a 0.5-μm-thick tin plating was formed on the formed conductive patterns 2. Then a 20-μm-thick cover insulating layer 3 was formed such that an outer lead portion 20 and an inner lead portion 30 were exposed respectively.

After that, the main and back surfaces of the printed circuit board 100 formed in the above way were covered with resist layers that are not illustrated. Then, resist patterns were formed excluding the areas corresponding to slits 9 by the ultraviolet exposure process and the developing process.

Following the above, the exposed reinforcement layer 7 was etched with chemicals. In this way, a plurality of slits 9 were formed between a plurality of reinforcement layers 7 on the outer lead portion 20. As a result, the printed circuit board 100 of the inventive example 1 was manufactured.

Comparative Example 1

A printed circuit board 100a of the comparative example 1 shown in FIG. 3(b) differs from the printed circuit board 100 of the inventive example 1 in that the reinforcement layers 7 are not provided by etching all the reinforcement layer 7.

Comparative Example 2

A printed circuit board 100b of the comparative example 2 shown in FIG. 3(c) differs from the printed circuit board 100 of the inventive example 1 in that the slits 9 are not formed.

(Evaluation)

First, the glass substrate 4 with the anisotropic conductive film (ACF) 5 was prepared. The terminal part 6 was not provided on the glass substrate 4.

After this glass substrate 4 was joined onto the outer lead wirings 2a in the outer lead portion 20 of the printed circuit board 100 by the ACF 5, heat treatment (heat press) was carried out for the substrate with the pressure of 2 MPa for 10 seconds in the temperature environment of 180° C. The same treatment as with the printed circuit board 100 of the above-mentioned inventive example 1 was carried out to the printed circuit board 100a of the comparative example 1 and the printed circuit board 100b of the comparative example 2.

In the inventive example 1, the comparative example 1 and the comparative example 2, nine printed circuit boards were fabricated respectively and connected to the glass substrates 4 as mentioned above.

Then, the extension of distance between the outer lead wirings 2a on both ends of the outer lead portion 20 was measured before and after the connection. The measurement results are shown in Table 1. The distance before the connection is 38.520 mm and the difference between the maximum and the minimum of the above-mentioned extension is represented as R on the Table 1.

TABLE 1

|  | Inventive Example 1 | Comparative Example 1 | Comparative Example 2 |
| --- | --- | --- | --- |
| No. 1 | 0.076 | 0.025 | 0.080 |
| No. 2 | 0.075 | 0.042 | 0.075 |
| No. 3 | 0.079 | 0.030 | 0.076 |
| No. 4 | 0.080 | 0.031 | 0.077 |
| No. 5 | 0.078 | 0.029 | 0.079 |
| No. 6 | 0.079 | 0.037 | 0.077 |
| No. 7 | 0.076 | 0.035 | 0.078 |
| No. 8 | 0.079 | 0.038 | 0.076 |
| No. 9 | 0.077 | 0.040 | 0.079 |
| Average | 0.078 | 0.034 | 0.077 |
| Maximum | 0.080 | 0.042 | 0.080 |
| Minimum | 0.075 | 0.025 | 0.075 |
| Difference between Maximum & Minimum [R] | 0.005 | 0.017 | 0.005 |
| Thermal Cycling Test | Nothing Abnormal | Nothing Abnormal | Separation |

As shown in Table 1, the differences R in the inventive example 1 and the comparative example 2 are smaller than the difference R of the comparative example 1, and the variations of the extension mentioned above are small. This indicates that the reliability of connection is improved. (Evaluation 1)

Moreover, it is considered that the reason that the distances after connection are larger than the distances before the connection (which means the extension occurs) result from the expansion of the base insulating layer 1 caused by thermal expansion.

In addition, it is considered that the reason that the above mentioned extension in the comparative example 1 is small results from the fact that the influence of contraction caused by dehydration of the printed circuit board 100a is larger compared to those of the respective printed circuit boards 100, 100b of the inventive example 1 and the comparative example 2 due to the lack of the reinforcement layers 7.

Next, as mentioned above, a thermal cycling test was carried out on each of the printed circuit boards 100, 100a and 100b each connected to the glass substrate 4. This thermal cycling test was implemented by carrying out 1000 cycles, each consisting of leaving the printed circuit boards in the temperature environments of −35° C. for 30 minutes and 100° C. for another 30 minutes.

After the implementation of the thermal cycling test, the connecting conditions between the outer lead wirings 2a of the printed circuit boards 100, 100a and 100b and the glass substrates were observed with a microscope.

As a result of that, although no abnormality was found in the above-mentioned connecting conditions of the printed circuit boards 100 of the inventive example 1 and the printed circuit boards 100a of the comparative example 1, the ACFs 5 on both ends of the outer lead portion 20 were removed from the glass substrates 4 in the printed circuit board 100b of the comparative example 2. (Evaluation 2)

According to the evaluations 1 and 2 mentioned above, it was found out that the reliability of connection can be improved by using the printed circuit boards 100 of the inventive example 1 each having the slits 9 between the reinforcement layers 7.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board on which a semiconductor device is to be mounted, comprising:
    an insulating layer having first and second surfaces;
    a conductive pattern that includes outer lead wiring provided on the first surface of said insulating layer;
    a cover layer provided on said first surface to cover the conductive pattern excluding the outer lead wiring; and
    a reinforcement layer provided on an area of said second surface opposite the outer lead wiring,
    wherein said reinforcement layer has at least one slit that extends in a direction parallel to said outer lead wiring, such that part of the second surface of said insulating layer is exposed, and wherein the outer lead wiring is provided on an area of said first surface excluding an area of said first surface corresponding to said at least one slit.

2. The printed circuit board according to claim 1, wherein said reinforcement layer includes metal.

3. The printed circuit board according to claim 2, wherein said metal includes stainless steel.

4. The printed circuit board according to claim 1, wherein said insulating layer includes at least one of a polyimide film, a polyethylene terephthalate film, a polyethernitrile film, and a polyethersulfone film.

5. The printed circuit board according to claim 1, wherein said conductive pattern includes at least one of copper, copper alloy, gold, and aluminum.

6. The printed circuit board according to claim 1, wherein the conductive pattern further includes inner lead wiring and the cover layer is provided so as not to cover the inner lead wiring.

7. A printed circuit board on which a semiconductor device is to be mounted, comprising:

an insulating layer having first and second surfaces;

a conductive pattern that includes outer lead wiring provided on the first surface of said insulating layer;

a cover layer provided on said first surface to cover the conductive pattern excluding the outer lead wiring; and a reinforcement layer provided only on an area of said second surface opposite the outer lead wiring, wherein said reinforcement layer has at least one slit such that part of the second surface of said insulating layer is exposed.

8. The printed circuit board according to claim 7, wherein said at least one slit extends in a direction parallel to said outer lead wiring.

9. The printed circuit board according to claim 7, wherein said conductive pattern is provided on an area of said first surface excluding an area on said first surface corresponding to said at least one slit.

10. The printed circuit board according to claim 7, wherein said reinforcement layer includes metal.

11. The printed circuit board according to claim 10, wherein said metal includes stainless steel.

12. The printed circuit board according to claim 7, wherein said insulating layer includes at least one of a polyimide film, a polyethylene terephthalate film, a polyethernitrile film, and a polyethersulfone film.

13. The printed circuit board according to claim 7, wherein said conductive pattern includes at least one of copper, copper alloy, gold, and aluminum.

14. The printed circuit board according to claim 7, wherein the conductive pattern further includes inner lead wiring and the cover layer is provided so as not to cover the inner lead wiring.

* * * * *